United States Patent [19]

Lins et al.

[11] 4,101,972

[45] Jul. 18, 1978

[54] BUBBLE DOMAIN PROPAGATION USING OSCILLATING STRIPE DOMAINS

[75] Inventors: Stanley James Lins, Bloomington; Roger Edward Lund, Woodbury; Marlin Marshall Hanson, Cologne, all of Minn.

[73] Assignee: Sperry Rand Corporation, New York, N.Y.

[21] Appl. No.: 798,975

[22] Filed: May 20, 1977

[51] Int. Cl.² ............................................. G11C 19/08
[52] U.S. Cl. ........................................ 365/29; 365/32
[58] Field of Search ................................. 340/174 TF

[56] References Cited

U.S. PATENT DOCUMENTS

| 3,887,905 | 6/1975 | Bobeck et al. | 340/174 TF |
| 3,916,395 | 10/1975 | Urai | 340/174 TF |
| 3,944,842 | 3/1976 | Dorleijn et al. | 340/174 TF |
| 3,996,571 | 12/1976 | Chang | 340/174 TF |

*Primary Examiner*—James W. Moffitt
*Attorney, Agent, or Firm*—Kenneth T. Grace; William E. Cleaver; Marshall M. Truex

[57] ABSTRACT

Disclosed is an apparatus for and a method of propagating bubble domains along fixed guidance channel forming stripe domains by capturing them in moveable stripe domains and then moving the capturing moveable stripe domains. The memory plane comprises a non-magnetic Gadolinium Gallium Garnet (GGG) layer which is a supporting substrate upon which are successively formed by the liquid phase epitaxy (LPE) method: a first stripe domain layer, a first non-magnetic spacer layer; a bubble domain layer; a second non-magnetic spacer layer; a second stripe domain layer; and a third non-magnetic spacer layer upon which is formed the necessary propagation circuitry. The method of propagating the bubble domains involves forming fixed guidance channel forming stripe domains in the first stripe domain layer, orienting moveable stripe domains in the second stripe domain layer in a direction orthogonal to the direction of the fixed guidance channels, establishing bubble domains in the bubble domain layer at selected ones of each fixed guidance channel, moveable stripe domain intersection and finally oscillating the moveable stripe domains in a direction parallel to the fixed guidance channels by a time-varying, i.e., temporally changing, localized bias field gradient. A moveable stripe domain in a first position under a bias field gradient producing strip line captures a bubble domain, slowly moves the bubble domain a predetermined propagation direction under the strip line and along its associated fixed guidance channel into a second position under the strip line and then subsequently quickly moves back to its first position under the strip line allowing the bubble domain to escape therefrom leaving the propagated, escaped bubble domain in the second position under the strip line to be captured by a next adjacent downstream moveable stripe domain. Successive capture, propagate, escape operations propagate all the bubble domains along each capturing moveable stripe domain, in parallel, in the downstream propagation direction through the memory plane.

4 Claims, 8 Drawing Figures

BUBBLE DOMAIN PROPAGATION USING OSCILLATING STRIPE DOMAINS

BACKGROUND OF THE INVENTION

The present invention is considered an improvement invention of that of the copending patent application of Stanley J. Lins, Ser. No. 710,773, filed Aug. 2, 1976, and assigned to the Sperry Rand Corporation, as is the present patent application. In this copending patent application of S. J. Lins, there is disclosed a laminated, integral structure that forms a bubble domain memory plane for the generation, storage and transfer of single wall domains, bubble domains or bubbles. The memory plane is formed of a non-magnetic Gadolinium Gallium Garnet (GGG) support member. Formed upon the support member is a magnetizable layer in which are formed a plurality of fixed stripe domains. Formed upon the stripe domain layer is a non-magnetic Gadolinium Gallium Garnet (GGG) spacer layer and formed upon the spacer layer is a magnetizable layer in which single wall domains or bubble domains are capable of being generated, sustained and transferred from one position to another along a planar dimension of the bubble domain layer. Formed upon the bubble domain layer is a non-magnetic Gadolinium Gallium Garnet spacer layer and formed upon the spacer layer is a magnetizable layer that is capable of sustaining moveable stripe domains. Bubble domains are then established at each fixed stripe domain, moveable stripe domain intersection. Means are then provided for moving the moveable stripe domain in a direction parallel to the fixed stripe domains whereby the bubble domains are carried along their associated fixed stripe domains by the associated moving stripe domain, the bubble domains and the moveable stripe domains being capable of being propagated from one end of the memory plane to the other. An additional prior art reference is that of the A. H. Bobeck, et al., U.S. Pat. No. 3,887,905 in which undulations in a domain wall propagate the bubble domains along the domain wall.

SUMMARY OF THE INVENTION

The present invention is directed toward a propagation scheme that is considered to be an improvement over that of the hereinabove referenced S. J. Lins patent application and the A. H. Bobeck patent. The present invention includes the application of bipolar drive currents to two strip lines superposed first and last parallel moveable stripe domains. The drive current waveform has a relatively low amplitude positive polarity pulse followed by a relatively high amplitude negative polarity pulse for oscillating the moveable stripe domains in a direction parallel to the orthogonally oriented fixed guidance channels of the memory plane. A moveable stripe domain in a first upstream position captures a bubble domain. The positive polarity pulse generates a small normal field amplitude gradient across the width of the strip line that slowly moves the moveable stripe domain and the captured bubble domain in the predetermined propagation or downstream direction along its associated fixed guidance channel into a second downstream position. The negative polarity pulse then generates a large normal field amplitude gradient across the width of the strip line that quickly moves the moveable stripe domain back to its first upstream position allowing the captured bubble domain to escape therefrom leaving the propagated bubble domain in its second downstream position to be recaptured by a next adjacent downstream moveable stripe domain that has been moved into its upstream position. Successive capture, propagate, escape operations propagate all the bubbles, in parallel, along each of the moveable stripe domains in the propagation direction through the memory plane.

DESCRIPTION OF THE PREFERRED EMBODIMENT

Figure 1:
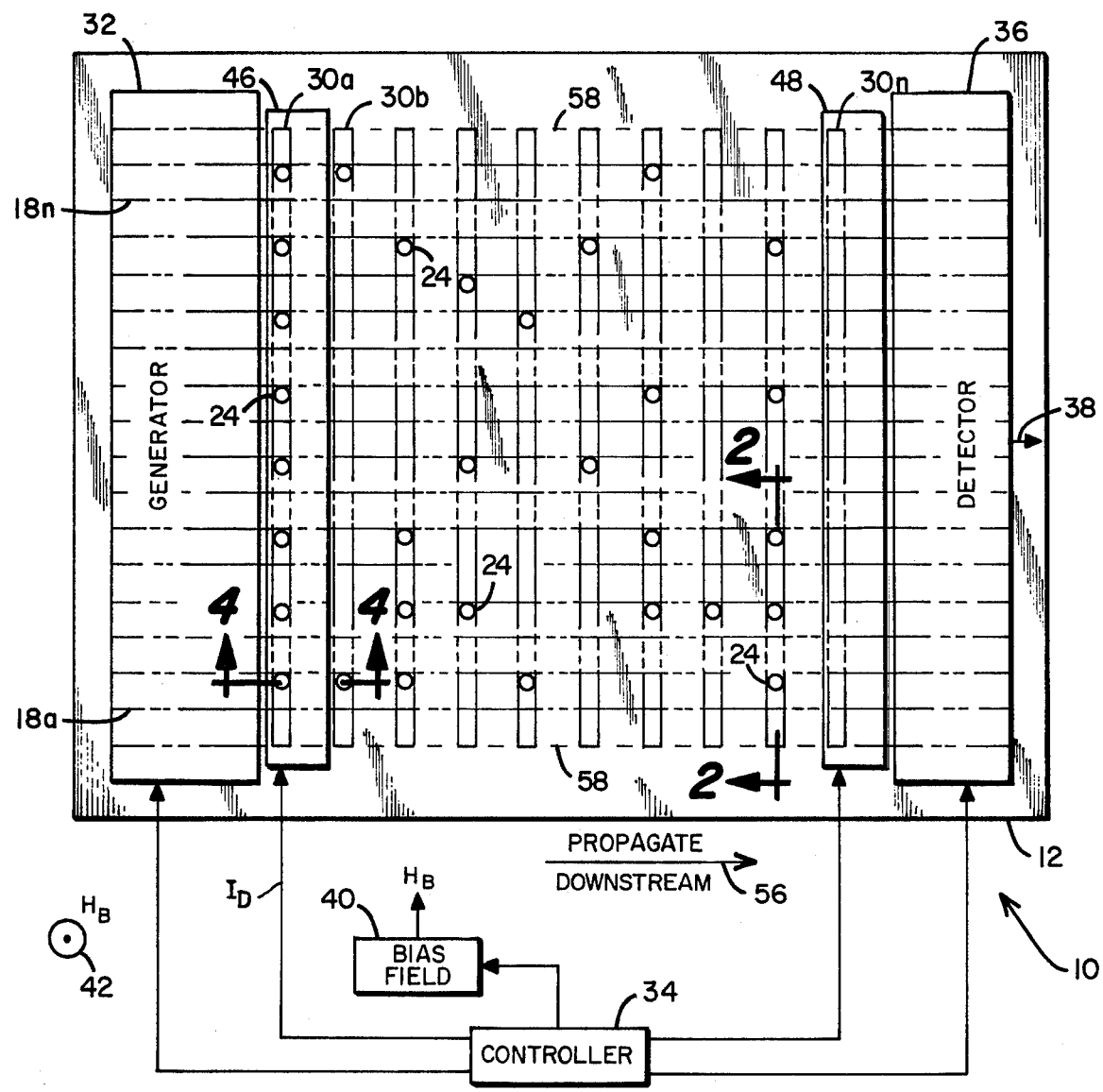
FIG. 1 is a block diagram of a system incorporating the present invention.
Figure 2:
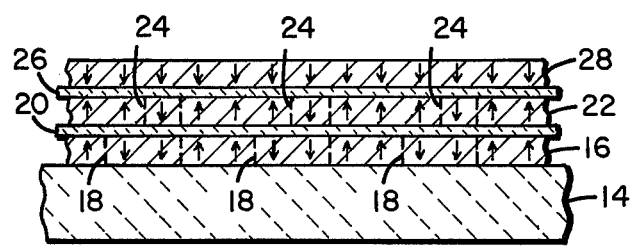
FIG. 2 is a cross sectional view of the memory plane of FIG. 1 taken along line 2—2 thereof.

With particular reference to FIG. 1 there is presented a block diagram of a system 10 incorporating the present invention. System 10 includes a memory plane 12 which is a laminated, integral structure the layers of which are preferably formed by the liquid phase epitaxy (LPE) method. With particular reference to FIG. 2 there is presented an illustration of a cross section of the memory plane 12 of FIG. 1 taken along line 2—2 thereof.

FIG. 2 illustrates that memory plane 12 comprises a plurality of stacked, superposed layers preferably integrally formed by the liquid phase epitaxial method and comprises a non-magnetic garnet support layer 14 of Gadolinium Gallium Garnet (GGG) of approximately 800 microns ($\mu$m) in thickness upon which are formed the following successive layers. Upon support layer 14 there is generated a stripe domain layer 16 of a magnetizable material of 3 - 10 $\mu$m in thickness in which are formed a plurality of relatively wide, fixed guidance channel forming stripe domains 18. Next, upon stripe domain layer 16 there is generated a non-magnetic garnet spacer layer 20 of GGG of 0.5 - 10 $\mu$m in thickness. Next, upon spacer layer 20 there is generated a bubble domain layer 22 of a magnetizable material of 3 - 10 $\mu$m in thickness in which bubble domains 24 may be generated, sustained and moved about. Next, upon bubble domain layer 22 there is generated a non-magnetic garnet spacer layer 26 of GGG of 0.5 - 10 $\mu$m in thickness. Next, upon spacer layer 26 there is generated a stripe domain layer 28 of a magnetizable material of 3 - 10 $\mu$m in thickness in which stripe domains 30 may be generated, sustained and moved about.

Upon the moveable stripe domain layer 28, as by many well known vapor deposition techniques, there is formed the generator 32 —see FIG. 1—, which under control of controller 34, selectively generates the bubble domains 24 for insertion into the upstream or leftmost moveable stripe domain 30a and along the associated fixed guidance channel 18 of fixed stripe domain layer 16. At the downstream or righthand end of memory plane 12 there is formed, as by many well known techniques, the detector 36, which under control of controller 34 detects and provides on line 38 a suitable output signal that is indicative of the existence vel non of the bubbles 24 that are coupled thereto by the rightmost moveable stripe domain 30n. Also provided is bias field source 40 for providing the steady state bias field $H_B$ indicated by the dot and concentric circle 42 indicative of a field directed normal to the plane of memory plane 12. Formed upon stripe domain layer 28 and separated therefrom by an insulative layer 44 of silicon dioxide ($SiO_2$) of 0.50 - 2.0 $\mu$m in thickness are two strip lines 46, 48 of copper of 0.1 - 1.0 $\mu$m in thickness to which controller 34 couples the drive current $I_D$ waveform of FIG. 3.

A brief description of the operation of system 10 of FIG. 1 is as follows. With controller 34 energizing bias field source 40, generator 32 selectively generates a plurality of bubble domains 24 which are coupled to the lefthand or upstream end of the parallel set of horizontally oriented fixed guidance channels 18. Under the influence of the steady state bias field $H_B$ and the drive field $H_D$, which is generated by the drive current $I_D$ and which in the area of the affected stripe domain 30a (and 30n) is algebraically additive to the steady state bias field $H_B$, i.e., $H_Z = H_B + H_D$, the parallel set of vertically oriented, in FIG. 1, moveable stripe domains 30 are caused to move in a downstream direction whereby the bubble domains 24 associated with each of the moveable stripe domains 30 are, in parallel, propagated in a downstream direction, from left to right, under the influence of the relatively low amplitude positive polarity pulse 50 of the drive current $I_D$ of FIG. 3. Upon the next succeeding relatively high amplitude negative polarity pulse 52 of the drive current $I_D$ the so-captured and propagated bubbles 24 are in effect left behind the moveable stripe domains 30 which are forced to move rapidly back to the left-most upstream position whereby the next adjacent downstream moveable stripe domains 30 capture the bubble domains 24 left there by the immediately next adjacent upstream moveable stripe domain 30.

The theory of operation of such method whereby the movement of the bubble domains 24 lag behind and escape from the movement of the moveable stripe domains 30 when subjected to the large normal field amplitude gradient across the width of the strip line 46 is more fully discussed in the text "Magnetic Bubbles", T. H. O'Dell, John Wiley & Sons, pp. 98 - 114. Additionally, the theory of operation whereby the potential well formed by the next adjacent downstream moveable stripe domain 30 captures the escaped bubble domains 24 left behind by the movement of the upstream moveable stripe domain 30 is more fully discussed in the publication "Bubble Domains in Double Garnet Films", Y. S. Lin, et al, JAP, Vol. 45, No. 9, September 1974, pp. 4084 - 4094.

After successive oscillations of the parallel set of vertically oriented moveable stripe domains 30, the bubble domains 24, after the successive capture, propagate and release sequences, are propagated across the bubble domain area of memory plane 12 in the propagate direction, denoted by vector 56, through the downstream, right-most moveable stripe domain 30n from which bubble domains 24 are detected by detector 36 in the well known manner. Memory plane 12 is preferably formed with a barrier region 58 which defines the active area of memory plane 12.

Figure 3:
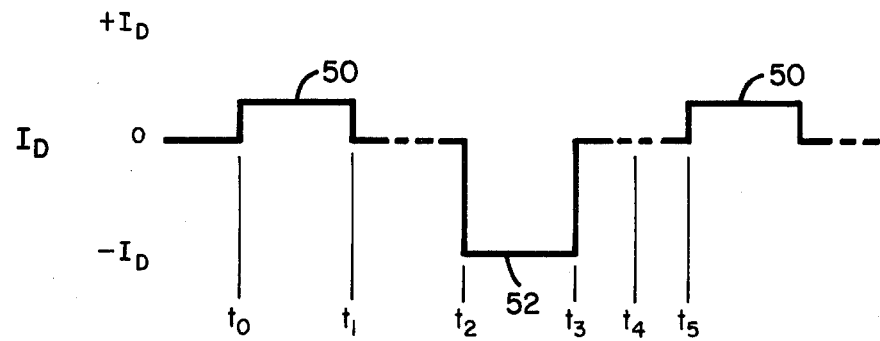
FIG. 3 is an illustration of the waveform of the drive signal that is utilized by the system of FIG. 1.

With particular reference to FIG. 3 there is presented an illustration of the waveform of the drive current $I_D$ that is coupled to strip lines 46, 48 and that is utilized by system 10 of FIG. 1. With particular reference to FIGS. 4a through 4e there are presented illustrations of the effects of the waveform of FIG. 3 upon the propagation of the moveable stripe domains 30 and the associated captured bubble domains 24 as grossly illustrated in FIG. 1.

The operation of system 10 of FIG. 1 consists of the process of coupling drive field $H_D$ that is directed normal to the plane of memory plane 12 and along the edges of strip lines 46, 48 by means of the drive current $I_D$ waveform of FIG. 3. The steady state bias field $H_B$ and the drive field $H_D$ provide, in the areas under the energized strip lines 46, 48, the normal field $H_Z$ having the waveforms illustrated in FIGS. 4a through 4d. This normal field $H_Z$ causes the directly affected stripe domains 30a, 30n (and indirectly the stripe domains therebetween) to oscillate between relative upstream and downstream positions along and under the upstream and downstream edges of the energized strip lines 46, 48. This oscillation of the moveable stripe domains 30 causes the moveable stripe domains 30 in their left-most or downstream position to capture bubble domains 24 previously transferred or propagated along their associated fixed guidance channels 18 by the next adjacent upstream moveable stripe domain 30, and to move toward the right or in a downstream direction, carrying the so-captured bubble domains 24 therealong.

Upon the application of the relatively high-amplitude negative polarity pulse 52 of the drive current $I_D$ of FIG. 3, the so-captured and propagated bubble domains 24, because the moveable stripe domains 30, under the influence of the relatively large normal field $H_Z$ amplitude gradient—$\Delta H_Z$—across the width of the strip lines 46, 48, move too fast to maintain the capture of the associated bubble domains 24, such bubble domains 24 escape the leftward or upstream moving stripe domains 30 to be left behind in their maximum downstream positions within their associated fixed guidance channels 18 whereupon the next adjacent downstream moveable stripe domain 30, upon reaching its left-most or maximum upstream position captures such bubble domains 24 whereupon the process is repeated upon successive modulations of the normal field $H_Z$, and, accordingly, the moveable stripe domains 30.

With reference back to FIGS. 3 and 4a through 4e and with particular reference to FIG. 4a there are illustrated the positions of the moveable stripe domains 30a, 30b, when at time $t_0$ system 10 of FIG. 1 is, via a low amplitude current pulse 50, initially subject to a normal field $H_Z$ amplitude gradient from amplitude 60 to amplitude 62 across the width of strip line 46—see FIG. 3 and FIG. 4a. At this time, bubble domain 24a is captured by moveable stripe domain 30a and is positioned within the associated fixed guidance channels 18a, e.g., at the associated moveable stripe domain 30, fixed guidance channel 18 intersection.

Figure 4A:
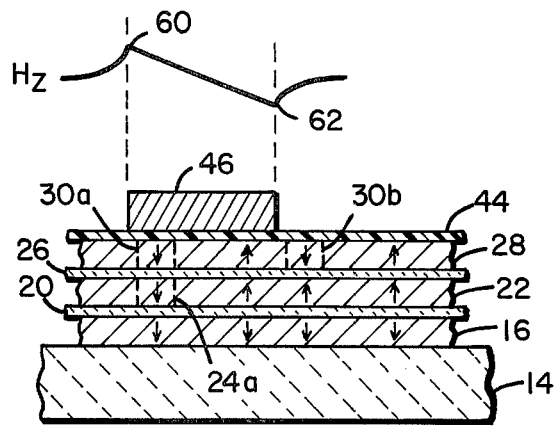
FIGS. 4a through 4e, cross-sectional views taken along line 4—4 of FIG. 1, are illustrations of the successive effects of the waveform of FIG. 3 upon the propagation of the moveable stripe domains and the bubble domains of FIG. 1.
Figure 4B:
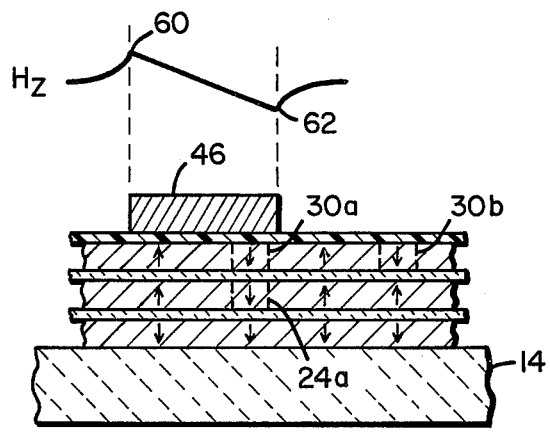

Next, during the time $t_0 - t_1$, drive field source 34 couples to system 10, via pulse 50, a slowly changing normal field $H_Z$ amplitude gradient. The maximum intensity gradient from amplitude 60 to amplitude 62 across the width of strip line 46 is just sufficient to move the parallel set of vertically oriented, in FIG. 1, stripe domains 30a, 30b into their maximum downstream position while moving or propagating the captured bubble domain 24a along its associated fixed guidance channel 18a. This condition, at time $t_1$, is illustrated in FIG. 4b.

Figure 4C:
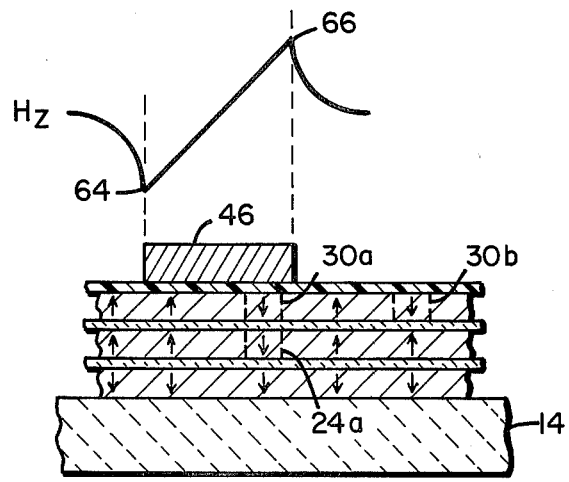

Next, at time $t_2$, controller 34 initially couples to system 10, via a high amplitude current pulse 52, a high normal field $H_Z$ amplitude gradient from amplitude 64 to amplitude 66 across the width of strip line 46—see FIG. 3 and FIG. 4c.

Figure 4D:
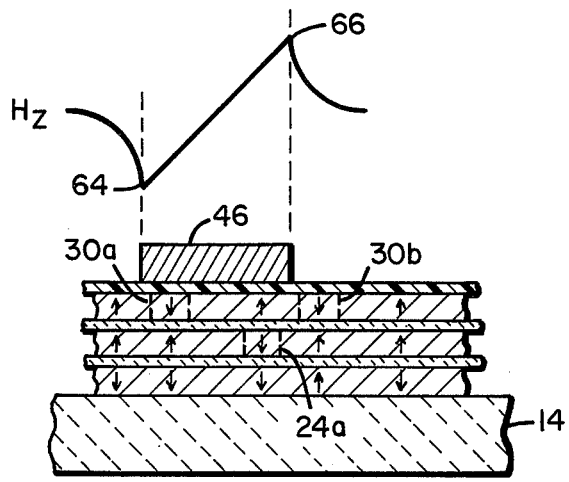

Next, during the time $t_2 - t_3$ controller 34 continues to couple to system 10, via pulse 52, a high normal field $H_Z$ amplitude gradient from amplitude 64 to amplitude 66 across the width of strip line 46. As the moveable stripe domains 30a, 30b move so fast under the influence of the high normal field $H_Z$ amplitude gradient from amplitude 64 to amplitude 66 across the width of strip line 46, bubble domain 24a escapes from the potential well formed by stripe domain 30a and is left behind in its maximum downstream position. Concurrently, stripe domain 30b is moved into its maximum upstream position whereupon the escaped bubble domain 24a comes under the influence of the potential well formed by stripe domain 30b. This condition, at time $t_3$, is illustrated in FIG. 4d.

Figure 4E:
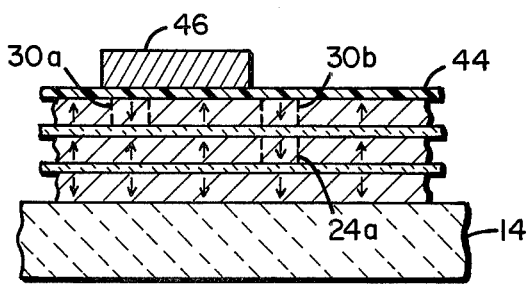

Lastly, after the termination of pulse 52 at time $t_3$ and before the initiation of the next succeeding pulse 50 at time $t_5$, as when $H_Z = H_B$, bubble domain 24a is captured by the potential well formed by stripe domain 30b and is moved downstream to be oriented at the moveable stripe domain 30b, fixed stripe domain 18a intersection. This condition, at time $t_4$, is illustrated in FIG. 4e.

Accordingly, it can be seen that the present invention provides a novel means of structuring the positions of a plurality of bubble domains within a memory plane while concurrently propagating such bubble domains through the memory plane in a predetermined and predictable manner. By utilizing the intersections of a parallel set of fixed guidance channels and an orthogonally oriented parallel set of moveable stripe domains in conjunction with a normal field of a waveform that causes the moveable stripe domains to oscillate between maximum upstream and downstream positions under the so-effecting energized strip lines, the natural structure of the magnetic characteristics of the stripe domain and bubble domain layers are utilized thereby permitting the elimination of complex overlays of, e.g., copper drive lines and Permalloy propagation patterns.

What is claimed is:

1. A method of propagating stripe domains, comprising:
    orienting in a stripe domain layer a set of parallel stripe domains that are orthogonal to a propagation direction;
    coupling in the plane of said stripe domain layer and parallel to said propagation direction a normal field $H_Z$ having temporally succeeding cycles of a relatively small normal field amplitude gradient across an energizing strip line followed by a relatively large normal field amplitude gradient across said energizing strip line; and
    oscillating said stripe domains between a maximum downstream position under said stripe line and a maximum upstream position under said strip line when affected by said small normal field amplitude gradient across said energizing strip line and said large normal field amplitude gradient across said energizing strip line, respectively.

2. A method of propagating bubble domains, comprising:
    orienting in a moveable stripe domain layer a set of parallel moveable stripe domains that are orthogonal to a propagation direction;
    orienting in a fixed stripe domain layer a set of parallel fixed stripe domains that are aligned along said propagation direction;
    orienting said set of parallel moveable stripe domains and said set of parallel fixed stripe domains in a superposed manner for forming a plurality of moveable stripe domain, fixed stripe domain intersections;
    orienting bubble domains at selected ones of said intersections;
    coupling in the plane of said moveable stripe domain layer and parallel to said propagation direction a normal field $H_Z$ having temporally succeeding cycles of a relatively small normal field amplitude gradient across an energizing strip line followed by a relatively large normal field amplitude gradient across said energizing strip line;
    oscillating one of said set of parallel moveable stripe domains between a maximum downstream position and a maximum upstream position under said strip line when affected by said relatively small normal field amplitude gradient and said relatively large normal field amplitude gradient, respectively;
    propagating said bubble domains in said propagation direction along the associated ones of said fixed stripe domains and into said maximum downstream position when said one moveable stripe domain is affected by said relatively small normal field amplitude gradient; and
    leaving said bubble domains behind in said maximum downstream position when said one moveable stripe domain is affected by said relatively large normal field amplitude gradient.

3. Bubble domain propagation apparatus, comprising:
    a non-magnetic substrate;
    a fixed guidance channel layer of magnetizable material in which are formed a set of parallel, fixed guidance channels;
    a first spacer layer;
    a bubble domain layer of magnetizable material in which a plurality of bubble domains may be generated, sustained and moved about;
    a second spacer layer;
    a moveable stripe domain layer of magnetizable material in which a set of parallel moveable stripe domains may be generated, sustained and moved about, said set of parallel moveable stripe domains oriented orthogonal to said set of parallel, fixed guidance channels for forming a plurality of moveable stripe domain, fixed guidance channel intersections;
    a third spacer layer;
    a pair of strip lines, each one superposed and parallel to a separate one of said moveable stripe domains;
    bubble generator means for coupling bubble domains to selected ones of said intersections;
    drive current means for coupling a bipolar drive current $I_D$ to both of said strip lines;
    said strip lines coupling a normal field $H_Z$ to only said superposed moveable stripe domains, said normal field $H_Z$ having temporally succeeding cycles of a relatively small normal field amplitude gradient across said strip lines followed by a relatively large normal field amplitude gradient across said strip lines.

4. The bubble domain propagation apparatus of claim 3 further including:
    bias field generator means for coupling a steady state bias field $H_B$ normal to the plane of said substrate and providing a steady state component to said normal field $H_Z$.

* * * * *